United States Patent
Wang et al.

(10) Patent No.: US 12,269,973 B2
(45) Date of Patent: Apr. 8, 2025

(54) ENCAPSULATION ADHESIVE FILM FOR SOLAR CELL AND PREPARATION METHOD AND USE THEREFOR

(71) Applicant: CYBRID TECHNOLOGIES INC., Suzhou (CN)

(72) Inventors: Lei Wang, Suzhou (CN); Ya Zheng, Suzhou (CN); Hongye Chen, Suzhou (CN); Keiichi Uno, Suzhou (CN); Xiaoping Wu, Suzhou (CN)

(73) Assignee: CYBRID TECHNOLOGIES INC., Suzhou (CN)

( * ) Notice: Subject to any disclaimer, the term of this patent is extended or adjusted under 35 U.S.C. 154(b) by 1196 days.

(21) Appl. No.: 16/958,138

(22) PCT Filed: Dec. 25, 2018

(86) PCT No.: PCT/CN2018/123373
§ 371 (c)(1),
(2) Date: Jul. 16, 2020

(87) PCT Pub. No.: WO2019/128962
PCT Pub. Date: Jul. 4, 2019

(65) Prior Publication Data
US 2020/0354611 A1    Nov. 12, 2020

(30) Foreign Application Priority Data
Dec. 27, 2017   (CN) .......................... 201711440273.8

(51) Int. Cl.
*C09J 7/10*      (2018.01)
*C09J 4/06*      (2006.01)
(Continued)

(52) U.S. Cl.
CPC . *C09J 7/10* (2018.01); *C09J 4/06* (2013.01); *C09J 11/04* (2013.01); *C09J 11/06* (2013.01);
(Continued)

(58) Field of Classification Search
CPC ....... C09J 7/10; C09J 4/06; C09J 11/04; C09J 11/06; C09J 2203/322; C09J 2203/33;
(Continued)

(56) References Cited

U.S. PATENT DOCUMENTS

2001/0045229 A1   11/2001   Komori et al.
2010/0286315 A1   11/2010   Tomiyama
(Continued)

FOREIGN PATENT DOCUMENTS

CN   101878537 A   11/2010
CN   101978511 A    2/2011
(Continued)

OTHER PUBLICATIONS

Translation of CN-102863918-A, Fu et al (Year: 2013).*
(Continued)

*Primary Examiner* — Nathan L Van Sell
(74) *Attorney, Agent, or Firm* — Knobbe, Martens, Olson & Bear, LLP

(57) ABSTRACT

The present disclosure relates to an encapsulation adhesive film for a solar cell, comprising a transparent layer in contact with a cell sheet, and a first adhesive film layer in contact with the transparent layer, wherein raw materials of the first adhesive film layer comprise the following components: a resin and a colored filler with a mass ratio of 3 to 25:1, a cross-linking agent accounting for 0.1% to 5% of the total mass of the resin and the colored filler, an auxiliary cross-linking agent accounting for 0.1% to 1% of the total mass of the resin and the colored filler, a coupling agent accounting for 0.1% to 1% of the total mass of the resin and the colored filler, a light stabilizer accounting for 0.1% to 1% of the total mass of the resin and the colored filler, and a photo initiator accounting for 0.1% to 5% of the total mass of the resin and the colored filler. The present disclosure can effectively prevent a white substance from overflowing.

15 Claims, 1 Drawing Sheet

(51) Int. Cl.
*C09J 11/04* (2006.01)
*C09J 11/06* (2006.01)
*H01L 31/048* (2014.01)

(52) U.S. Cl.
CPC ...... *C09J 2203/322* (2013.01); *C09J 2203/33* (2013.01); *C09J 2301/122* (2020.08); *C09J 2301/208* (2020.08); *H01L 31/0481* (2013.01)

(58) Field of Classification Search
CPC ............ C09J 2301/122; C09J 2301/208; C09J 2301/414; C09J 2423/04; C09J 2429/00; C09J 2431/00; C09J 7/30; C09J 2301/408; C09J 2471/00; H01L 31/0481; C08K 3/013; C08K 3/36; C08K 2003/2227; C08K 2003/2241; C08K 2003/265; Y02E 10/50
See application file for complete search history.

(56) References Cited

U.S. PATENT DOCUMENTS

| | | | |
|---|---|---|---|
| 2011/0100416 A1 | 5/2011 | Kataoka et al. | |
| 2016/0177007 A1* | 6/2016 | Ulbricht | C08F 226/06 156/60 |
| 2017/0015870 A1* | 1/2017 | Nishijima | H10K 50/8426 |

FOREIGN PATENT DOCUMENTS

| | | |
|---|---|---|
| CN | 101878537 B | 11/2012 |
| CN | 102832280 A | 12/2012 |
| CN | 202888211 U | 4/2013 |
| CN | 102863918 B | 7/2014 |
| CN | 103013364 B | 1/2015 |
| CN | 104497899 B | 8/2016 |
| CN | 107216830 A | 9/2017 |
| CN | 106684186 B | 5/2018 |
| CN | 108148517 A | 6/2018 |
| EP | 1164167 A1 | 12/2001 |
| EP | 2216828 A1 | 8/2010 |
| EP | 2262001 A1 | 12/2010 |
| EP | 2216828 B1 | 11/2013 |
| ES | 2442502 T3 | 2/2014 |
| JP | 2004352966 A | 12/2004 |
| JP | 2009152543 A | 7/2009 |
| JP | WO2009/116638 A1 | 9/2009 |
| JP | 5177752 B2 | 1/2013 |
| WO | 01/32772 A1 | 5/2001 |
| WO | 2009069543 A1 | 6/2009 |
| WO | 2009116638 A1 | 9/2009 |

OTHER PUBLICATIONS

International Search Report for International Application No. PCT/CN2018/123373, dated Mar. 27, 2019 in 7 pages (English Translation included).

* cited by examiner

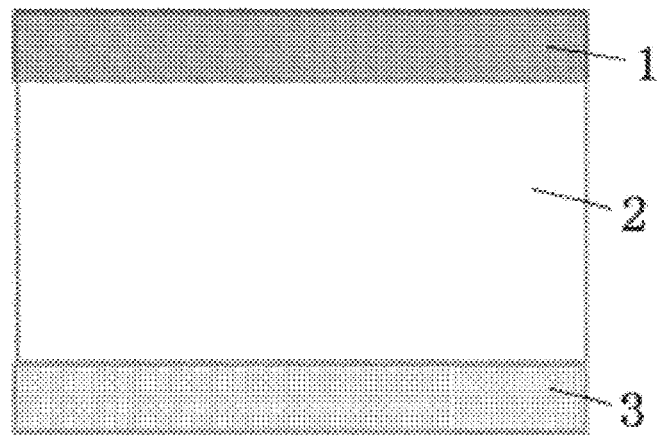

ENCAPSULATION ADHESIVE FILM FOR SOLAR CELL AND PREPARATION METHOD AND USE THEREFOR

CROSS-REFERENCE TO RELATED APPLICATIONS

This application is the U.S. National Phase under 35. U.S.C. § 371 of International Application PCT/CN2018/123373, filed Dec. 25, 2018, which claims priority to Chinese Patent Application No. 201711440273.8, filed Dec. 27, 2017. The disclosures of the above-described applications are hereby incorporated by reference in their entirety.

TECHNICAL FIELD OF THE INVENTION

The present disclosure relates to an encapsulation adhesive film for a solar cell and a preparation method and use thereof.

BACKGROUND OF THE INVENTION

The white adhesive film can be used in the lower layer of the module, can achieve the purpose of increasing the power of the module by reflecting visible light and near-infrared light, and can be applied to single glass modules and double glass modules. The requirements for the appearance of the modules are rather stringent, and the white adhesive film must not overflow onto the cell sheets, bus bars and welding strips, and must not have defects such as folds.

In the prior art, the following solutions are usually adopted to solve the problem of white substance overflow of the white adhesive film:

1. Pre-crosslinking process: through pre-crosslinking, the adhesive film is partially crosslinked, so as to achieve the purpose of controlling white substance overflow. Disadvantages: it has poor stripping strength, and the components are not heat and drying resistant.

2. Low melting index process: the possibility of white substance overflow is reduced by reducing the resin melting finger. Disadvantages: it has poor ability to control overflow, and the components still have flanging.

3. Non-woven fabric compositing process: through compositing a layer of non-woven fabric, the purpose of controlling white substance overflow is achieved. Disadvantages: due to the introduction of foreign matters (non-woven fabrics) in the assembly, it has poor long-term reliability.

SUMMARY OF THE INVENTION

The technical solution to be solved by the present disclosure is to provide an encapsulation adhesive film for a solar cell that can solve the problem of overflowing of a white substance well, and a preparation method and use thereof.

To solve the above technical problems, the present disclosure employs the following technical solution:

An objective of the present disclosure is to provide an encapsulation adhesive film for a solar cell, comprising a transparent layer in contact with a cell sheet, and a first adhesive film layer in contact with the transparent layer, the composition of the first adhesive film layer comprises following components: a resin and a colored filler with a mass ratio of 3 to 25:1, a cross-linking agent accounting for 0.1% to 5% of the total mass of the resin and the colored filler, an auxiliary cross-linking agent accounting for 0.1% to 1% of the total mass of the resin and the colored filler, a coupling agent accounting for 0.1% to 1% of the total mass of the resin and the colored filler, a light stabilizer accounting for 0.1% to 1% of the total mass of the resin and the colored filler, and a photo initiator accounting for 0.1% to 5% of the total mass of the resin and the colored filler.

According to an advantageous embodiment, the mass ratio of the resin and the colored filler in the first adhesive film layer is 3 to 5:1.

According to an advantageous embodiment, the encapsulation adhesive film for a solar cell further comprises a second adhesive film layer in contact with a back-sheet or a glass.

According to another embodiment, the encapsulation adhesive film for a solar cell further comprises one or more third adhesive film layers arranged between the first adhesive film layer and the second adhesive film layer.

In the present disclosure, the first adhesive film layer, the second adhesive film layer and the transparent layer are not limited to one layer, and may be multiple layers of the same formula. The third adhesive film layer may be an adhesive film layer adopted a conventional formula.

According to a preferred embodiment of the invention, the composition of the second adhesive film layer comprises a resin and a colored filler with a mass ratio of 15 to 25:1.

More preferably, the composition of the second adhesive film layer comprises a cross-linking agent accounting for 0.1% to 5% of the total mass of the resin and the colored filler, an auxiliary cross-linking agent accounting for 0.1% to 1% of the total mass of the resin and the colored filler, a coupling agent accounting for 0.1% to 1% of the total mass of the resin and the colored filler, and a light stabilizer accounting for 0.1% to 1% of the total mass of the resin and the colored filler.

The second adhesive film layer in the present disclosure is also a white layer, but when compared with the first adhesive film layer, the amount of white filler added is small, therefore, the second adhesive film layer can well maintain the adhesive property to the back-sheet or glass, and at the same time, the second adhesive film layer and the first adhesive film layer have a large total thickness, high reflectivity, and a large increased power.

According to another embodiment, a thickness of the transparent layer is 20 to 60 microns. If the thickness of the transparent layer is too thick, although it can better prevent white substance overflow, it will affect the power of the solar cell; if the transparent layer is too thin, the ability to prevent white substance overflow is limited.

In the present disclosure, due to the presence of the transparent layer, the physical properties of the adhesive film are not significantly changed by the addition of titanium dioxide or the presence of the pre-crosslinked layer, and the stripping strength from the cell sheet, the surface hardness, etc. are not significantly changed.

According to a preferred embodiment of the invention, the composition of the transparent layer comprises a resin, a cross-linking agent accounting for 0.1% to 5% of the mass of the resin, an auxiliary cross-linking agent accounting for 0.1% to 1% of the mass of the resin, a coupling agent accounting for 0.1% to 1% of the mass of the resin, and a light stabilizer accounting for 0.1% to 1% of the mass of the resin.

According to a preferred embodiment of the invention, the resin is selected from the group consisting of EVA, POE, PVB, and combinations thereof.

In the present disclosure, the resins in the first adhesive film layer, the second adhesive film layer and the transparent layer may be the same resin, or may be different resins.

According to a preferred embodiment of the invention, the colored filler is selected from the group consisting of titanium dioxide, calcium carbonate, silicon dioxide, aluminum oxide, zinc-titanium whites, and combinations thereof.

In the present disclosure, the colored fillers in the first adhesive film layer and the second adhesive film layer may be the same colored filler, or may be different colored fillers.

According to a preferred embodiment of the invention, the colored filler of the present disclosure is a white filler.

According to a preferred embodiment of the invention, the photo initiator is selected from the group consisting of 2-hydroxy-2-methyl-1-phenyl-1-propanon, 1-hydroxycyclohexyl phenyl ketone, benzophenone, diphenyl(2,4,6-trimethylbenzoyl)phosphine oxide, 2-benzyl-2-(dimethylamino)-1-(4-morpholino phenyl) butanone, 2-hydroxy-1-(4-(2-hydroxy-2-methylpropionylphenyl) benzyl)-2-methyl-1-propanon, macromolecular photoinitiators thioxanthones, visible-light photo initiator camphor quinone, and combinations thereof.

According to a preferred embodiment of the invention, the cross-linking agent is selected from the group consisting of tert-butyl peroxy 2-ethylhexyl carbonate, t-butyl peroxyisopropyl carbonate, dibenzoyl peroxide, dicumyl peroxide, 2,5-dimethyl-2,5-bis(tert-butylperoxy)hexane, cyclohexanone peroxide, tert-butyl hydroperoxide, tert-butyl peroxybenzoate, tert-butyl peroxyacetate, di-(4-tert-butylcyclohexyl) peroxybicarbonate, tert-butyl 3,5,5-trimethylperoxyhexanoate, triallyl isocyanate, and combinations thereof.

In the present disclosure, the cross-linking agents in the first adhesive film layer, the second adhesive film layer and the transparent layer may be the same, or may be different.

According to a preferred embodiment of the invention, the auxiliary cross-linking agent is selected from the group consisting of trimethylolpropane triacrylate, 2-trimethylolpropane tetraacrylate, propoxylated trimethylolpropane triacrylate, and combinations thereof.

In the present disclosure, the auxiliary cross-linking agents in the first adhesive film layer, the second adhesive film layer and the transparent layer may be the same, or may be different.

According to a preferred embodiment of the invention, the coupling agent is selected from the group consisting of 3-methacryloxypropylmethyltrimethoxysilane, (3-glycidylpropyl) trimethoxysilane, vinyltrimethoxysilane, 3-amimopropyltriethoxysilane, and combinations thereof.

In the present disclosure, the coupling agents in the first adhesive film layer, the second adhesive film layer and the transparent layer may be the same, or may be different.

According to a preferred embodiment of the invention, the light stabilizer is selected from the group consisting of bis(2,2,6,6-tetramethyl-4-piperidyl) sebacate, poly(4-hydroxy-2,2,6,6 -tetramethyl-1-piperidine ethanol-alt-1,4-butanedioic acid), poly-{[6-[(1,1,3,3-tetramethylbutyl)-imino]-1,3,5-triazine-2,4-diyl][2-(2,2,6,6-tetramethylpiperidye-nitrilo]-hexamethylene-[4-(2,2,6,6-tetrame thylpiperidyl)-amino], and combinations thereof.

In the present disclosure, the light stabilizers in the first adhesive film layer, the second adhesive film layer and the transparent layer may be the same, or may be different.

Another objective of the present disclosure is to provide a preparation method of an encapsulation adhesive film for a solar cell, comprising following steps preformed successively:

Step (1), after separately preparing the raw materials of the first adhesive film layer and the transparent layer, tape casting through an extruder to form films;

Step (2), on the side where the transparent layer is, irradiating through a UV lamp so that UV passes through the transparent layer to reach the first adhesive film layer and promotes a crosslinking reaction on the surface of the first adhesive film layer;

Step (3): after cooling, pulling and winding to obtain an encapsulation adhesive film for a solar cell.

According to a preferred embodiment of the invention, Step (1) uses a co-extrusion casting machine for casting film formation.

According to a preferred embodiment of the invention, a processing temperature of Step (1) is 60 to 110° C.

According to a preferred embodiment of the invention, in Step (3), after three-roll setting, cooling and winding are performed.

According to a preferred embodiment of the invention, a cooling temperature of Step (3) is 20 to 50° C.

A third objective of the present disclosure is to provide use of an encapsulation adhesive film for a solar cell in a solar cell.

Due to the implementation of the above technical solutions, the present disclosure has the following advantages over the prior art:

The present disclosure adopts a transparent layer and a first adhesive film layer, wherein the layer in contact with the cell sheet is the transparent layer, which to a certain extent blocks the white substance in the first adhesive film layer from overflowing to the cell sheet, bus bars and soldering strips, and plays a certain role in preventing white substance overflow; a photo initiator is added to the formula of the first adhesive film layer, and during the preparation process, UV light penetrates the transparent layer, reaches the first adhesive film layer, and initiates a cross-linking reaction on the surface of the first adhesive film layer, so that there is a pre-cross-linked layer on the surface of the first adhesive film layer, and the presence of this pre-cross-linked layer further effectively prevents white substance overflow.

The encapsulation adhesive film of the present disclosure has good adhesion to the cell sheet and the glass or backsheet, high reflectivity, and a great increase in the power of the solar cell.

BRIEF DESCRIPTION OF THE DRAWINGS

FIG. 1 is a schematic structure diagram of the present disclosure;

wherein, 1—transparent layer; 2—first adhesive film layer; 3—second adhesive film layer.

DETAILED DESCRIPTION OF EXEMPLARY EMBODIMENTS

In the following, the present disclosure is further explained in detail combining with specific embodiments, but the present disclosure is not limited to the following embodiments. The implementation conditions adopted in the embodiments can be further adjusted according to different requirements of specific use, and the implementation conditions not specified are the conventional conditions in the industry. All other embodiments obtained by a person of ordinary skill in the art without creative work fall within the protective scope of the present disclosure.

Embodiment 1

The thickness of the transparent layer 1 was 50 microns, and its raw materials components were, EVA: 100 kg;

tert-butyl peroxy 2-ethylhexyl carbonate: 0.6 kg; triallyl isocyanate: 0.8 kg; trimethylolpropane triacrylate: 0.6 kg; 3-methacryloxypropylmethyltrimethoxysilane: 0.5 kg; bis(2,2,6,6-tetramethyl-4-piperidyl) sebacate: 0.2 kg.

The thickness of the first adhesive film layer 2 was 300 microns, and its raw materials components were, EVA: 82 kg; titanium dioxide: 18 kg; tert-butyl peroxy 2-ethylhexyl carbonate:0.5 kg; 2-hydroxy-2-methyl-1-phenyl-1-propanon: 1.2 kg; triallyl isocyanate: 0.7 kg; trimethylolpropane triacrylate: 0.5 kg; 3-methacryloxypropylmethyltrimethoxysilane: 0.4 kg; bis(2,2,6,6-tetramethyl-4-piperidyl) sebacate: 0.3 kg.

The thickness of the second adhesive film layer 3 was 50 microns, and its raw materials components were, EVA: 94 kg; titanium dioxide: 6 kg; tert-butyl peroxy 2-ethylhexyl carbonate: 0.8 kg; triallyl isocyanate: 0.9 kg; trimethylolpropane triacrylate: 0.4 kg; 3-methacryloxypropylmethyltrimethoxysilane: 0.5 kg; bis(2,2,6,6-tetramethyl-4-piperidyl) sebacate: 0.6 kg.

The preparation method was: Step (1): the raw materials of the first adhesive film layer 2, the second adhesive film layer 3 and the transparent layer 1 were separately and evenly mixed, and then plastified by a co-extrusion casting machine, and extruded and casted into a film by a T-shaped die, and the processing temperature was set to 80° C.;

Step (2): after exiting the die head, on the side where the transparent layer 1 was located, UV light was irradiated so that UV passed through the transparent layer 1 to the first adhesive film layer 2, and since the die head was just exited, the product was in a molten state and had a high temperature, and after being irradiated through the UV lamp, the photo initiator on the surface of the first adhesive film layer 2 generated free radicals, and the free radicals further induced a crosslinking reaction on the surface of the first adhesive film layer 2 to form a pre-crosslinked layer;

Step (3): the product processed in Step (2) was shaped through three-roll setting, and then cooled at 20° C., pulled and winded to obtain an encapsulation adhesive film for a solar cell.

Embodiment 2

It is basically the same as Embodiment 1, differing by that, the resin used in the first adhesive film layer, the second adhesive film layer, and the transparent layer was POE.

Embodiment 3

It is basically the same as Embodiment 2, differing by that, the photo initiator in the first adhesive film layer was 1-hydroxycyclohexyl phenyl ketone.

Embodiment 4

It is basically the same as Embodiment 2, differing by that, the photo initiator in the second adhesive film layer was benzophenone.

Embodiment 5

It is basically the same as Embodiment 2, differing by that, the photo initiator in the first adhesive film layer was 2-hydroxy-1-(4-(2-hydroxy-2-methylpropionylphenyl) benzyl)-2-methyl-1-propanon.

Embodiment 6

It is basically the same as Embodiment 2, differing by that, the photo initiator in the first adhesive film layer was 2-benzyl-2-(dimethylamino)-1-(4-morpholino phenyl) butanone.

Embodiment 7

It is basically the same as Embodiment 1, differing by that, the thickness of the transparent layer was 60 microns.

Embodiment 8

It is basically the same as Embodiment 1, differing by that, the thickness of the transparent layer was 40 microns.

Embodiment 9

It is basically the same as Embodiment 1, differing by that, the thickness of the transparent layer was 20 microns.

Embodiment 10

It is basically the same as Embodiment 1, differing by that, in the raw materials of the first adhesive film layer, EVA was 75 kg; titanium dioxide was 25 kg.

Embodiment 11

It is basically the same as Embodiment 1, differing by that, in the raw materials of the first adhesive film layer, EVA was 83 kg; titanium dioxide was 17 kg.

Embodiment 12

It is basically the same as Embodiment 1, differing by that, in the raw materials of the first adhesive film layer, the addition amount of the photo initiator was 2 kg.

Embodiment 13

It is basically the same as Embodiment 1, differing by that, in the raw materials of the first adhesive film layer, the addition amount of the photo initiator was 3 kg.

Embodiment 14

It is basically the same as Embodiment 1, differing by that, in the raw materials of the first adhesive film layer, the addition amount of the photo initiator was 5 kg.

Embodiment 15

It is basically the same as Embodiment 1, differing by that, in the raw materials of the first adhesive film layer, the addition amount of the photo initiator was 0.5 kg.

Embodiment 16

It is basically the same as Embodiment 1, differing by that, in the raw materials of the second adhesive film layer, EVA was 96 kg; titanium dioxide was 4 kg.

Embodiment 17

It is basically the same as Embodiment 1, differing by that, the thickness of the first adhesive film layer was 350 microns, without a second adhesive film layer.

Embodiment 18

It is basically the same as Embodiment 1, differing by that, a conventional third white adhesive film layer with a thickness of 50 microns was provides between the first adhesive film layer and the second adhesive film layer.

Embodiment 19

It is basically the same as Embodiment 1, differing by that, in the first adhesive film layer, EVA was 90 kg; titanium dioxide was 10 kg.

Control 1

It is basically the same as Embodiment 1, differing by that, the thickness of the transparent layer was 70 microns.

Control 2

It is basically the same as Embodiment 1, differing by that, the thickness of the transparent layer was 10 microns.

The experimental data of the respective embodiments and controls are shown in Table 1.

The test methods of crosslinking degree, stripping strength and reflectivity in the present disclosure refer to GB/T29848-2013 (Chinese standard "Ethylene-vinyl acetate copolymer (EVA) adhesive film for photovoltaic module encapsulation"). The test method of assembly power refers to IEC61215 standard.

| | Adhesive film | | | | Assembly | | |
|---|---|---|---|---|---|---|---|
| | Cross-linking degree % | Stripping strength from back-sheet N/cm | Stripping strength from glass N/cm | Reflectivity % | Assembly power W | Assembly appearance | Appearance after DH1000H |
| Embodiment 1 | 82.5 | 78 | 158 | 97.2 | 266.65 | Good, no overflow or folds | Good, no obvious yellowing or delamination |
| Embodiment 2 | 77.3 | 72 | 136 | 97.5 | 266.55 | Good, no overflow or folds | Good, no obvious yellowing or delamination |
| Embodiment 3 | 84.1 | 77 | 157 | 97.8 | 266.58 | Good, no overflow or folds | Good, no obvious yellowing or delamination |
| Embodiment 4 | 87.8 | 86 | 147 | 96.9 | 266.67 | Good, no overflow or folds | Good, no obvious yellowing or delamination |
| Embodiment 5 | 81.3 | 79 | 146 | 97.5 | 266.75 | Good, no overflow or folds | Good, no obvious yellowing or delamination |
| Embodiment 6 | 83.8 | 85 | 152 | 97.8 | 266.45 | Good, no overflow or folds | Good, no obvious yellowing or delamination |
| Embodiment 7 | 82.8 | 87 | 153 | 97.2 | 265.05 | Good, no overflow or folds | Good, no obvious yellowing or delamination |
| Embodiment 8 | 84.5 | 90 | 153 | 97.5 | 266.95 | Good, no overflow or folds | Good, no obvious yellowing or delamination |
| Embodiment 9 | 82.6 | 82 | 144 | 98.0 | 267.35 | Good, no overflow or folds | Good, no obvious yellowing or delamination |
| Embodiment 10 | 83.5 | 88 | 158 | 98.2 | 266.95 | Good, no overflow or folds | Good, no obvious yellowing or delamination |
| Embodiment 11 | 81.4 | 79 | 162 | 95.3 | 265.75 | Good, no overflow or folds | Good, no obvious yellowing or delamination |
| Embodiment 12 | 92.5 | 84 | 153 | 97.0 | 266.67 | Good, no overflow or folds | Good, no obvious yellowing or delamination |

-continued

| | Adhesive film | | | | Assembly | | |
|---|---|---|---|---|---|---|---|
| | Cross-linking degree % | Stripping strength from back-sheet N/cm | Stripping strength from glass N/cm | Reflectivity % | Assembly power W | Assembly appearance | Appearance after DH1000H |
| Embodiment 13 | 95.5 | 83 | 152 | 97.0 | 266.35 | Good, no overflow or folds | Good, no obvious yellowing or delamination |
| Embodiment 14 | 97.5 | 84 | 153 | 97.0 | 266.66 | Good, no overflow or folds | Good, no obvious yellowing or delamination |
| Embodiment 15 | 79.5 | 85 | 156 | 97.2 | 266.65 | Good, no overflow or folds | Good, no obvious yellowing or delamination |
| Embodiment 16 | 83.2 | 84 | 153 | 96.2 | 266.75 | Good, no overflow or folds | Good, no obvious yellowing or delamination |
| Embodiment 17 | 82.7 | 56 | 130 | 98.2 | 266.75 | Good, no overflow or folds | Good, no obvious yellowing or delamination |
| Embodiment 18 | 82.5 | 79 | 152 | 97.8 | 266.67 | Good, no overflow or folds | Good, no obvious yellowing or delamination |
| Embodiment 19 | 82.8 | 77 | 152 | 93.2 | 265.35 | Good, no overflow or folds | Good, no obvious yellowing or delamination |
| Control 1 | 83.7 | 77 | 153 | 96.3 | 264.15 | Good, no overflow or folds | Good, no obvious yellowing or delamination |
| Control 2 | 82.7 | 75 | 150 | 98.2 | 268.65 | Slight overflow of the long side of the cell sheet | Good, no obvious yellowing or delamination |

Note:
Assemblies in the table refer to solar cells.

The above detailed describes the present disclosure, and are intended to make those skilled in the art being able to understand the present disclosure and thereby implement it, and should not be concluded to limit the protective scope of this disclosure. Any equivalent variations or modifications according to the spirit of the present disclosure should be covered by the protective scope of the present disclosure.

What is claimed is:

1. An encapsulation adhesive film for a solar cell comprising a transparent layer in contact with a cell sheet, a first adhesive film layer in contact with the transparent layer, and a second adhesive film layer in contact with a back-sheet or a glass,
   wherein the encapsulation adhesive film is between the cell sheet, and a glass or back-sheet,
   wherein a composition of the transparent layer comprises:
      a resin;
      a cross-linking agent accounting for 0.1% to 5% of a mass of the resin;
      an auxiliary cross-linking agent accounting for 0.1% to 1% of the mass of the resin;
      a coupling agent accounting for 0.1% to 1% of the mass of the resin; and
      a light stabilizer accounting for 0.1% to 1% of the mass of the resin,
   wherein a composition of the first adhesive film layers consists of:
      a resin and a colored filler with a mass ratio of 3 to 5:1;
      a cross-linking agent accounting for 0.1% to 5% of a total mass of the resin and the colored filler;
      an auxiliary cross-linking agent accounting for 0.1% to 1% of the total mass of the resin and the colored filler;
      a coupling agent accounting for 0.1% to 1% of the total mass of the resin and the colored filler;
      a light stabilizer accounting for 0.1% to 1% of the total mass of the resin and the colored filler; and
      a photo initiator accounting for 0.1% to 5% of the total mass of the resin and the colored filler, and
   wherein a composition of the second adhesive film layer consists of:
      a resin and a colored filler with a mass ratio of 15 to 25:1;
      a cross-linking agent accounting for 0.1% to 5% of the total mass of the resin and the colored filler;
      an auxiliary cross-linking agent accounting for 0.1% to 1% of the total mass of the resin and the colored filler;
      a coupling agent accounting for 0.1% to 1% of the total mass of the resin and the colored filler; and a light stabilizer accounting for 0.1% to 1% of the total mass of the resin and the colored filler.

2. The encapsulation adhesive film for a solar cell according to claim 1, comprising one or more third adhesive film layers arranged between the first adhesive film layer and the second adhesive film layer.

3. The encapsulation adhesive film for a solar cell according to claim 1, wherein a thickness of the transparent layer is 20 to 60 microns.

4. The encapsulation adhesive film for a solar cell according to claim 1, wherein the resin is selected from the group consisting of EVA, POE, PVB, and combinations thereof.

5. The encapsulation adhesive film for a solar cell according to claim 1, wherein, the colored filler is selected from the group consisting of titanium dioxide, calcium carbonate, silicon dioxide, aluminum oxide, zinc-titanium whites, and combinations thereof.

6. The encapsulation adhesive film for a solar cell according to claim 1, wherein the photo initiator is selected from the group consisting of 2-hydroxy-2-methyl-1-phenyl-1-propanon, 1-hydroxycyclohexyl phenyl ketone, benzophenone, diphenyl (2,4, 6-trimethylbenzoyl) phosphine oxide, 2-benzyl-2-(dimethylamino)-1-(4-morpholino phenyl) butanone, 2-hydroxy-1-(4-(2-hydroxy-2-methylpropionylphenyl) benzyl)-2-methyl-1-propanon, macromolecular photo initiators thioxanthones, visible-light photo initiator camphor quinone, and combinations thereof.

7. The encapsulation adhesive film for a solar cell according to claim 1, wherein the cross-linking agent is selected from the group consisting of tert-butyl peroxy 2-ethylhexyl carbonate, t-butyl peroxy-isopropyl carbonate, dibenzoyl peroxide, dicumyl peroxide, 2,5-dimethyl-2,5-bis(tert-butylperoxy) hexane, cyclohexanone peroxide, tert-butyl hydroperoxide, tert-butyl peroxybenzoate, tert-butyl peroxyacetate, di-(4-tert-butylcyclohexyl) peroxybicarbonate, tert-butyl 3,5,5-trimethylperoxyhexanoate, triallyl isocyanate, and combinations thereof.

8. The encapsulation adhesive film for a solar cell according to claim 1, wherein the auxiliary cross-linking agent is selected from the group consisting of trimethylolpropane triacrylate, 2-trimethylolpropane tetraacrylate, ethoxylated trimethylolpropane triacrylate, propoxylated trimethylolpropane triacrylate, and combinations thereof.

9. The encapsulation adhesive film for a solar cell according to claim 1, wherein the coupling agent is selected from the group consisting of 3-methacryloxypropylmethyltrimethoxysilane, (3-glycidylpropyl) trimethoxysilane, vinyltrimethoxysilane, 3-amimopropyltriethoxysilane, and combinations thereof.

10. The encapsulation adhesive film for a solar cell according to claim 1, wherein the light stabilizer is selected from the group consisting of bis (2,2,6,6-tetramethyl-4-piperidyl) sebacate, poly (4-hydroxy-2,2,6,6-tetramethyl-1-piperidine ethanol-alt-1,4-butanedioic acid), poly-{[6-[(1,1,3,3-tetramethylbutyl)-imino]-1,3,5-triazine-2,4-diyl][2-(2,2,6,6-tetramethylpiperidyl)-nitrilo]-hexamethylene-[4-(2,2,6,6-tetramethylpiperidyl)-amino], and combinations thereof.

11. A preparation method of the encapsulation adhesive film for a solar cell according to claim 1 comprising the following steps performed successively:
Step (1): after separately preparing raw materials of the second adhesive film layer, the first adhesive film layer, and the transparent layer, tape casting through an extruder to form films;
Step (2): on the a side where the transparent layer is, irradiating through a UV lamp so that UV passes through the transparent layer to reach the first adhesive film layer and promotes a crosslinking reaction on a surface of the first adhesive film layer; and
Step (3): after cooling, pulling and winding to obtain an encapsulation adhesive film for a solar cell.

12. The preparation method according to claim 11, wherein a processing temperature of Step (1) is 60 to 110° C.

13. The preparation method according to claim 11, wherein in Step (3), after three-roll setting, cooling and winding are performed.

14. The preparation method according to claim 11, wherein a cooling temperature of Step (3) is 20 to 50° C.

15. A solar cell comprising the encapsulation adhesive film for the solar cell according to claim 1.

* * * * *